US 6,650,183 B2

(12) United States Patent  (10) Patent No.: US 6,650,183 B2
Vaughan                        (45) Date of Patent:  Nov. 18, 2003

(54) AMPLIFIER APPARATUS FOR AN OUTPUT STAGE OF A LASER DRIVER CIRCUIT

(75) Inventor: Barry John Vaughan, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/120,322

(22) Filed: Apr. 11, 2002

(65) Prior Publication Data

US 2002/0175754 A1 Nov. 28, 2002

(30) Foreign Application Priority Data

May 25, 2001 (EP) .......................................... 01304661

(51) Int. Cl.$^7$ ............................................... H03F 3/45
(52) U.S. Cl. ........................ 330/252; 330/257; 330/260
(58) Field of Search ................................. 330/252, 260, 330/308, 257; 327/563

(56) References Cited

U.S. PATENT DOCUMENTS

| 4,267,516 A | 5/1981 | Traa ........................... 330/149 |
| 4,476,440 A | 10/1984 | Bennett, Jr. ................. 330/260 |
| 4,636,713 A | 1/1987 | Stefani ....................... 323/350 |
| 5,525,930 A | * 6/1996 | Pothast et al. ........... 330/260 X |
| 6,069,523 A | 5/2000 | Brown ........................ 327/563 |

FOREIGN PATENT DOCUMENTS

| EP | 0 566 990 A2 | 10/1993 |
| EP | 0 648 010 A1 | 4/1995 |
| JP | 62216284 | 9/1987 |
| JP | 09232884 | 9/1997 |

OTHER PUBLICATIONS

Claessen, L., Examiner. European Search Report, Application No. EP 01 30 4661, dated Nov. 23, 2001.
Rohe, Karl–Heinz, "Elektronik für Physiker", B.G. Teubner, Stuttgart, Germany, 1987, pp. 166–169.

* cited by examiner

Primary Examiner—Steven J. Mottola

(57) ABSTRACT

Known differential pair amplifier circuits can suffer from transistor saturation resulting in a reduction in switching speed. An alternative to the differential pair amplifier circuit is a common-emitter configuration, but the common-emitter configuration lacks differential operability and results in ground bounce. An amplifier circuit is provided for an output stage of a driver circuit comprising a pair of common emitter circuits cross-coupled by a pair of transistors. Slow operation is therefore overcome while providing a differential output signal in response to a differential input signal.

12 Claims, 2 Drawing Sheets

AMPLIFIER APPARATUS FOR AN OUTPUT STAGE OF A LASER DRIVER CIRCUIT

BACKGROUND OF THE INVENTION

1. Field of the Invention

The present invention relates to an amplifier apparatus of the type used as an output stage of a driver circuit, for example to drive a semiconductor laser device. The present invention also relates to a control circuit and/or a driver circuit comprising the amplifier apparatus.

2. Description of the Prior Art

It is known to employ a differential pair configuration in an output stage of a driver circuit for a laser device. The differential pair configuration typically comprises a first transistor and a second transistor independently coupled to a first supply rail by respective collector terminals of the first and second transistors. An emitter terminal of the first transistor is coupled to an emitter terminal of the second transistor, both emitter terminals of the first and second transistors also being coupled to a second supply rail via a current source. A potential difference of at least about 0V needs to exist between the collector terminal and the base terminal of the first or second transistors, depending upon which of the first or second transistors is conducting. If the potential difference is less than 0V, i.e. if the collector terminal of the first or second transistors is at a lower potential than the base terminal thereof, the first or second transistor will saturate resulting in a reduction in the switching speed of the first or second transistor. Given that at least approximately 400 mV is typically dropped across the current source and about 0.9V is likely to be dropped across the base-emitter junctions of the first or second transistors when conducting, the potential difference between the collector terminal of the first or second transistor, when conducting, and the second supply rail is likely to be greater than 1.2V. Consequently, the voltage headroom between the first supply rail and the collector terminal of the first or second transistor, when conducting, is limited.

In order to provide increased headroom for the differential pair configuration, the driver circuit can be operated at a higher operating voltage. However, the higher operating voltage is undesirable, because other components of the driver circuit, for example higher speed Complimentary Metal Oxide Semiconductor (CMOS) Integrated Circuits (ICs), will not operate at the higher operating voltage.

An alternative to using the differential pair configuration above, is to employ a single transistor arranged in a common emitter (open collector) configuration. The single transistor arranged in the common emitter configuration (hereinafter referred to as a "common emitter transistor arrangement") comprises a single bipolar transistor, a collector terminal of the single transistor being coupled to the first supply rail via a first load. An emitter terminal of the single transistor is coupled to the second supply rail via, for example, a second resistor and the base terminal of the single transistor receives a single input signal corresponding to a data signal. A single output signal is present at the collector terminal of the single transistor. The common emitter transistor arrangement requires less voltage headroom than the differential pair configuration, but switches at a slower speed than the differential pair configuration and the current amplitude of the single output signal is difficult to control. Additionally, the current of the single output signal is not balanced by an opposing current, resulting in occasional large current surges into the second supply rail (known as "ground bounce"). The large current surges into the second supply rail cause Electromagnetic Interference (EMI) spikes, which are undesirable. Also, it is difficult to control DC content of the single output signal.

AC coupling the output of the common emitter transistor arrangement can obviate the lack of voltage headroom but does not work without an internal DC load; the internal DC load dissipates power. Also, the AC coupling removes frequency component from the single output signal below a given frequency, depending upon values of electrical components used to implement the AC coupling. Removal of the low frequency components can, in some cases, cause distortion of a waveform constituting the single output signal.

SUMMARY OF THE INVENTION

According to a first aspect of the present invention, there is provided an amplifier circuit apparatus comprising a first input and a second input for respectively applying a first input signal and a second input signal, the first input being arranged to control a first active device of a first common emitter circuit having a first output, characterised by first circuit means coupled to the first common emitter circuit and the second input so as to enable, when in use, the first common emitter circuit to generate an output signal at the first output, the output signal corresponding to an amplification of a difference between the first input signal and the second input signal by a differential gain.

Preferably, the amplifier circuit is powered by a low voltage supply, for example below 3.6V, such as below 3.3V. Most preferably, the low voltage supply is below 2.5V.

Preferably, the apparatus further comprises a second active device of a second common emitter circuit coupled to the second input and having a second output, the first circuit means being arranged to enable, when in use, the first and second common emitter circuits to generate the output signal between the first and second outputs, the output signal corresponding to an amplification of a difference between the first input signal and the second input signal by a differential gain.

Preferably, the first circuit means comprises a third input to control a third active device and a fourth input to control a fourth active device, the first and second inputs being respectively coupled to the third and fourth inputs, and the third and fourth active devices being cross coupled.

Preferably, the apparatus further comprises at least one further circuit means arranged to mirror a predetermined amount of current flowing through the first and/or second common emitter circuits so as to provide at least one predetermined function.

Preferably, the predetermined function is the generation of a signal indicative of the output signal for controlling the output signal. More preferably, the at least one further circuit means comprises second circuit means comprising a fifth active device arranged to generate a first feedback component signal indicative of a first current flowing through the first active device.

When the first circuit means comprises the second active device, the second circuit means preferably comprises a sixth active device arranged to generate a second feedback component signal indicative of a second current flowing through the second active device.

Preferably, an amplitude of a third current flowing through the fifth active device is less than an amplitude of a first current flowing through the first active device.

Preferably, an amplitude of a fourth current flowing through the sixth active device is less than an amplitude of the second current.

Preferably, the amplitude of the third current is proportional to the amplitude of the first current.

Preferably, the density of the fourth current is proportional to the amplitude of the second current.

Preferably, the at least one predetermined function is a prevention of the output signal comprising a current level that exceeds a predetermined current level.

Preferably, the at least one further circuit means comprises third circuit means comprising a seventh active device arranged as a first integrated diode.

When the first circuit means comprises the second active device, the third circuit means preferably comprises an eighth active device arranged as a second integrated diode.

Preferably, an amplitude of a first current flowing through the first active device is proportional to a second amplitude of a fifth current flowing through the seventh active device.

Preferably, an amplitude of a second current flowing through the first active device is proportional to a an amplitude of a sixth current flowing through the eighth active device.

Preferably, the amplitude of the fifth current is lower than the amplitude of the first current.

Preferably, the amplitude of the sixth current is lower than the amplitude of the second current.

According to a second aspect of the present invention, there is provided a driver circuit for a laser device comprising the amplifier circuit apparatus as set forth above in relation to the first aspect of the present invention.

According to a third aspect of the present invention, there is provided an optical communications network comprising the amplifier circuit apparatus as set forth above in relation to the first aspect of the present invention.

It is thus possible to provide an amplifier circuit apparatus capable of providing the advantages of the single common emitter transistor arrangement without the disadvantages of slower switching speeds and difficult current amplitude control associated with the single output signal. The amplifier circuit apparatus can thus generate a balanced differential output signal that uses less voltage headroom than conventional differential-pair amplifier circuits, and does not result in ground bounce and, hence, EMI spikes. Also, it is possible to control DC content of the differential output signal. Additionally, current flowing through the laser device can be limited, thereby ensuring that light emissions from the laser device are maintained within safe parameters.

At least one embodiment of the present invention will now be described, by way of example only, with reference to the accompanying drawings, in which:

DETAILED DESCRIPTION OF THE INVENTION

Figure 1:
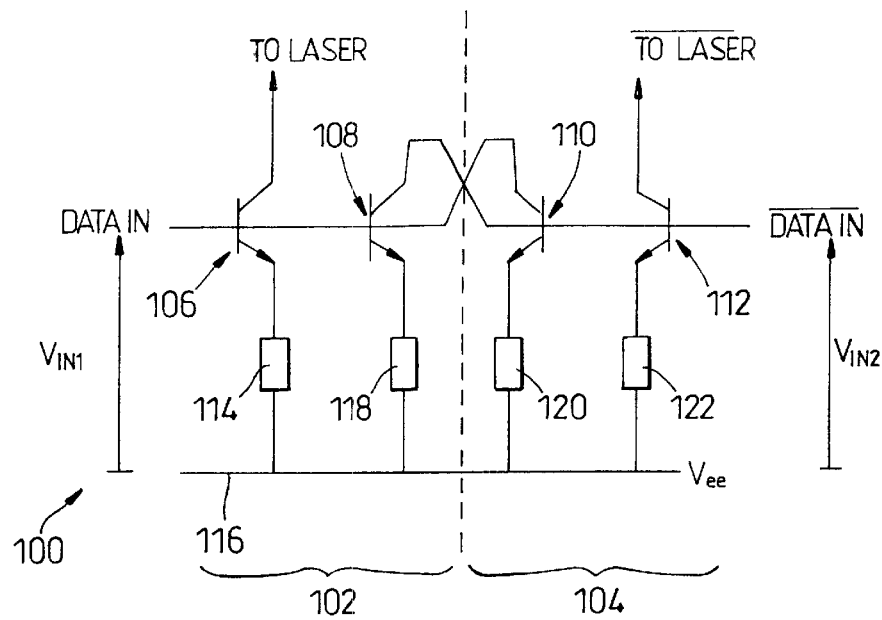
FIG. 1 is a schematic diagram of a first amplifier circuit constituting a first embodiment of the present invention.

For the avoidance of doubt, throughout the following description, identical reference numerals will be used to identify like parts.

Referring to FIG. 1, a basic output stage 100 comprises a first side 102 and a second side 104. The first side 102 comprises a first NPN transistor 106 and a second NPN transistor 108, and the second side comprises a third NPN transistor 110 and a fourth NPN transistor 112. A base terminal of the first transistor 106 is coupled to a source (not shown) of a first data signal, a collector terminal of the first transistor 106 being coupled to a first supply rail (not shown) at a first potential $V_{cc}$ via a load, for example a semiconductor laser device (also not shown). An emitter terminal of the first transistor 106 is coupled to a first terminal of a first resistor 114, a second terminal of the first resistor being coupled to a second supply rail 116 at a second potential $V_{ee}$ that is less than the first potential $V_{cc}$. The base terminal of the first transistor 106 is also coupled to a base terminal of the second transistor 108, a collector terminal of the second transistor 108 being coupled to a base terminal of the third transistor 110. An emitter terminal of the second transistor 108 is coupled to a first terminal of a second resistor 118, a second terminal of the second resistor 118 being coupled to the second supply rail 116.

The base terminal of the second transistor 108 is also coupled to a collector terminal of the third transistor 110, the coupling of the collector terminal of the second transistor 108 to the base terminal of the third transistor 110 and the collector terminal of the third transistor 110 to the base terminal of the second transistor 108 constituting a cross-coupling configuration. An emitter terminal of the third transistor 110 is coupled to a first terminal of a third resistor 120, a second terminal of the third resistor 120 being coupled to the second supply rail 116. The second and third resistors 118, 120 should be proportionally scaled with respect to the second and third transistors 108, 110, respectively.

The base terminal of the third transistor 110 is further coupled to a base terminal of the fourth transistor 112, a collector terminal of the fourth transistor 112 being coupled to the first supply rail (not shown) via a load impedance, for example a dummy semiconductor laser device (not shown). The base terminal of the fourth transistor 112 is also coupled to a source (not shown) of a second data signal, and the emitter terminal of the fourth transistor 112 is coupled to a first terminal of a fourth resistor 122, a second terminal of the fourth resistor 122 being coupled to the second supply rail 116.

The first transistor 106 in combination with the first resistor 114 and the semiconductor laser device constitute a first common emitter, or open collector, circuit. Similarly, the fourth transistor 112 in combination with the fourth resistor 122 and the load impedance constitute a second common emitter, or open collector, circuit.

Operation of the above output stage 100 will now be described in the context of a first input voltage $V_{IN1}$ generated by the source of the first data signal and a second input voltage $V_{IN2}$ generated by the source of the second data signal. In practice, the sources of the first and second data signals include a first source resistance $r_1$ and a second source resistance $r_2$. As an initial state to begin describing the output stage 100, it is assumed that the first and second input voltages $V_{IN1}$, $V_{IN2}$ are substantially equal, and a first input current $I_{IN1}$ and a second input current $I_{IN2}$ are respectively generated by the source of the first data signal and the source of the second data signal.

The first input voltage $V_{IN1}$ applied between the base terminal of the first transistor 106 and the second supply rail 116 causes the first transistor 106 to conduct. As the base terminal of the first transistor 106 is coupled to the base terminal of the second transistor 108, the first input voltage $V_{IN1}$ is also applied between the base terminal of the second transistor 108 and the second supply rail 116, also causing the second transistor 108 to conduct.

Conduction by the first transistor 106 causes a first output current $I_{O1}$ to be drawn by the first resistor 114, the first output current $I_{O1}$ flowing through the semiconductor laser device (not shown) from the first supply rail (not shown). Similarly, conduction by the second transistor 108 causes a proportion of the second input current $I_{IN2}$ drawn by the base terminals of the third and fourth transistor 110, 112 to be drawn by the second resistor 118, thereby reducing the second input current $I_{IN2}$.

Application of the second input voltage $V_{IN2}$ between the base terminals of the third and fourth transistors 110, 112 causes the third and fourth transistors 110, 112 to conduct. Conduction of the fourth transistor 112 causes a second output current $I_{O2}$ to be drawn by the fourth resistor 122, thereby causing the load impedance to dissipate energy, in this example through operation of the dummy semiconductor laser device. In addition, conduction by the third transistor 110 causes a proportion of the first input current $I_{IN1}$ drawn by the base terminals of the first and second transistors 106, 108 to be drawn by the third resistor 120.

In this example, the source of the first and second data signals operate so as to apply a differential input signal between the base terminals of the first and fourth transistors 106, 112.

If the first input voltage $V_{IN1}$ increases, conduction by the first and second transistors 106, 108 increases, resulting in the first output current $I_{O1}$ and the proportion of the second input current $I_{IN2}$ drawn through the second transistor 108 to increase. Increasing the proportion of the second input current $I_{IN2}$ drawn results in the second input current $I_{IN2}$ generated by the source of the second data signal to increase overall. Since the source of the second data signal includes the second source resistance $r_2$, the second source resistance $r_2$ causes a second source voltage drop thereacross. If the second input current $I_{IN2}$ increases, as is the case in the present example, the second source voltage drop across the second source resistance $r_2$ increases resulting in the second input voltage $V_{IN2}$ decreasing. Clearly, if the second input voltage $V_{IN2}$ decreases, conduction by the fourth transistor 112 reduces resulting in the second output current 102 decreasing. Additionally, conduction by the third transistor 110 reduces and consequently the proportion of the first input current $I_{IN1}$ drawn by the third resistor 120 decreases.

Similarly, an increase of the second input voltage $V_{IN2}$ yields a drop in the first input voltage $V_{IN1}$ and hence a reduction in the first output current $I_{O1}$ drawn by the first resistor 114 and the proportion of the second input current $I_{IN2}$ drawn by the second resistor 118. The operational principle that causes the basic output stage 100 to reduce the first output current 101 and increase the second output current $I_{O2}$ in response to increasing the second input voltage $V_{IN2}$ is the same as the operational principle already described above in relation to increasing the first input voltage $V_{IN1}$ and so will not be described further.

From the above described operation, the cross-coupling of the second and third transistors 108, 110 thus enable the basic output stage 100 to generate a differential output signal between the collector terminals of the first and fourth transistors 106, 112 in response to the differential input signal. It should be understood that the term "differential input signal" is intended to include maintaining the first input voltage $V_{IN1}$ at a fixed potential and varying the second input voltage $V_{IN2}$, or vice versa. Also, by coupling the first common emitter circuit to the second common emitter circuit, the first and second output currents $I_{O1}$, $I_{O2}$ are balanced and also coupled directly to the second supply rail 116, thereby preventing current surges from being generated in the basic output stage 100.

Without the second and third transistors 108, 110 and the second and third resistors 118, 120, a turn-on time of the basic output stage 100 is faster than a turn-off time of the basic output stage 100. The second and third transistors 108, 110 are sized, i.e. the emitters of the second and third transistors 108, 110 are fabricated with appropriate cross-sectional areas, such that currents flowing through the collector terminals of the second and third transistors 108, 110 are respectively proportionally smaller than the first and second output currents $I_{O1}$, $I_{O2}$. The second transistor 108 serves to mirror current to the base terminals of the third and fourth transistors 110, 112, thereby forcing down the potential at the base terminals of the third and fourth transistors 110, 112 and hence removing charges that prevent the first and fourth transistors from switching off quickly.

Figure 2:
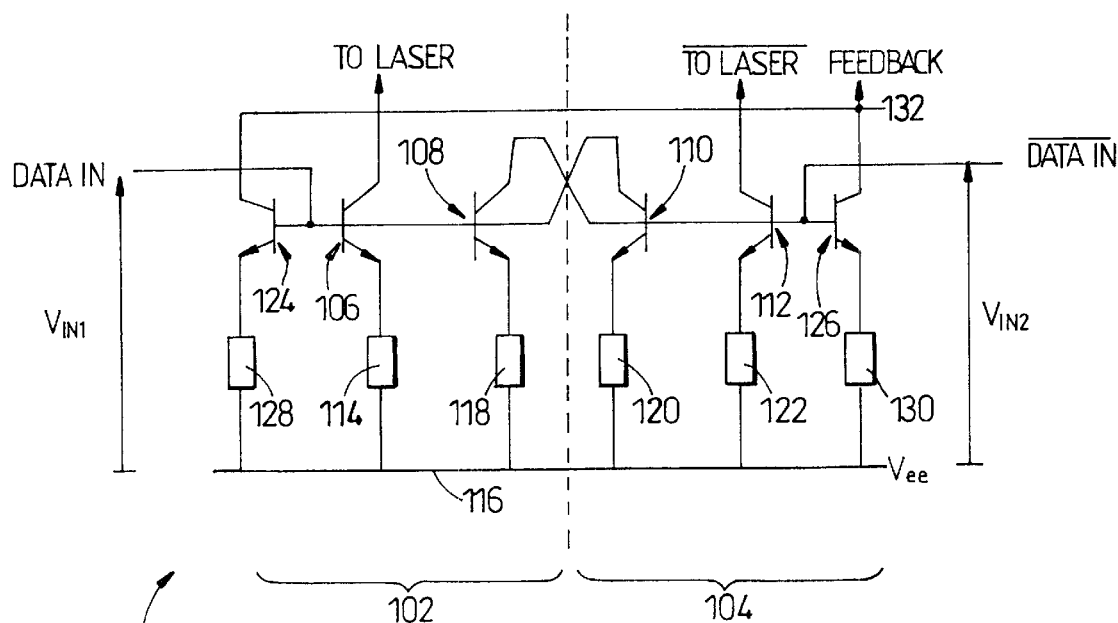
FIG. 2 is a schematic diagram of a second amplifier circuit constituting a second embodiment of the present invention.

Referring to FIG. 2, the basic output stage 100 of FIG. 1 is supplemented by a fifth NPN transistor 124, a sixth NPN transistor 126, a fifth resistor 128 and a sixth resistor 130 to form a second output stage 200. A base terminal of the fifth transistor 124 is coupled to the base terminals of the first and second transistors 106, 108, an emitter terminal of the fifth transistor 124 being coupled to a first terminal of the fifth resistor 128. A second terminal of the fifth resistor 128 is coupled to the second supply rail 116.

A collector terminal of the fifth transistor 124 is coupled to a collector terminal of the sixth transistor 126, a base terminal of the sixth transistor 126 being coupled to base terminals of the third and fourth transistors 110, 112. An emitter terminal of the sixth transistor 126 is coupled to a first terminal of the sixth resistor 130, a second terminal of the sixth resistor 130 being coupled to the second supply rail 116.

The fifth and sixth transistors 124, 126 are sized, i.e. the emitters of the fifth and sixth transistors 124, 126 are fabricated with appropriate cross-sectional areas, such that a first feedback current $I_{F1}$ representative of a small proportion of the first output current $I_{O1}$, for example one tenth of the first output current $I_{O1}$, and a second feedback current $I_{F2}$ representative of a small proportion, for example one tenth of the second output current $I_{O2}$, flows through the fifth and sixth transistors 124, 126. The fifth and sixth resistors 128, 130 should be proportionally scaled with respect to the fifth and sixth transistors 124, 126 respectively.

In operation, a portion of the second output stage 200 that is the basic output stage 100 operates as already described above in connection with FIG. 1 and so will not be described further. The fifth and sixth transistors 124, 126 serve to mirror the first and second output currents $I_{O1}$, $I_{O2}$, respectively. The first feedback current $I_{F1}$ and the second feedback current $I_{F2}$ are the result of the mirroring operation performed by the fifth and sixth transistors 124, 126. Since the collector terminals of the fifth and sixth transistors 124, 126 are coupled together a total feedback current IFT corresponding to a sum of the first feedback current $I_{F1}$ and the second feedback current $I_{F2}$ flows through a node 132 corresponding to a point of coupling of the collector terminals of the fifth and sixth transistors 124, 126.

The total feed back current $I_{FT}$ can be used in any suitable control loop known in the art, for example, a Proportional Integral Differential (PID) control loop to control the first and/or second input voltage $V_{IN1}$, $V_{IN2}$ or the first and/or second input currents $I_{IN1}$, $I_{IN2}$ depending upon whether the second output stage 200 is being current-, or voltage-, driven.

Figure 3:
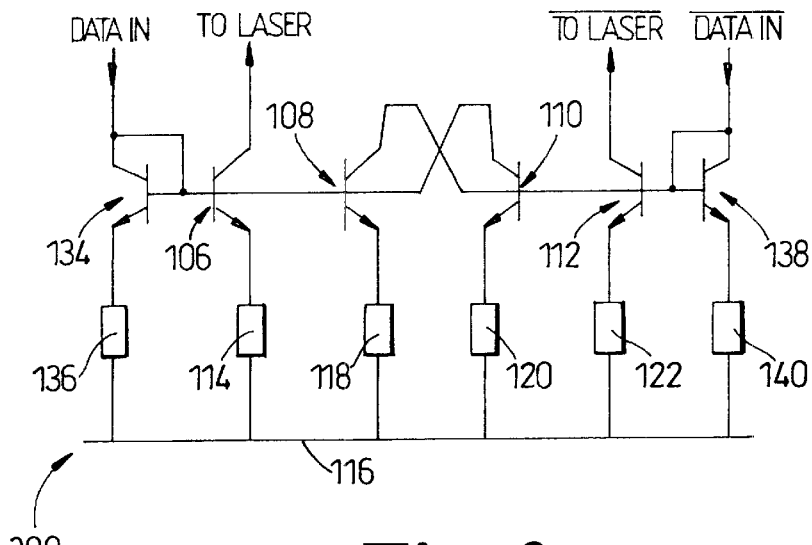
FIG. 3 is a schematic diagram of a third amplifier circuit constituting a third embodiment of the present invention.

Referring to FIG. 3, the basic output stage 100 of FIG. 1 is supplemented by a seventh NPN transistor 134, a seventh resistor 136, an eighth NPN transistor 138 and an eighth resistor 140 to form a third output stage 300.

A base terminal of the seventh transistor 134 is coupled to the base terminals of the first and second transistors 106, 108, an emitter terminal of the seventh transistor 134 being coupled to a first terminal of the seventh resistor 136. A second terminal of the seventh resistor 136 is coupled to the second supply rail 116. A collector terminal of the seventh transistor 134 is coupled to the base terminal thereof.

A base terminal of the eighth transistor 138 is coupled to the base terminals of the third and fourth transistors 110, 112, an emitter terminal of the eighth transistor 138 being coupled to a first terminal of the eighth resistor 140. A second terminal of the eighth resistor 140 is coupled to the second supply rail 116. A collector terminal of the eighth transistor 138 is coupled to the base terminal thereof.

In this example, the collector terminal of the seventh transistor 134 and the collector terminal of the eighth transistor 138 are coupled to the source of the first data signal (not shown) and the source of the second data signal (not shown), respectively.

The seventh and eighth transistors 134, 138 are sized, for example the emitters of the seventh and eighth transistors 134, 138 are fabricated with appropriate cross-sectional areas, such that the common-emitter current gain $\beta_1$ of the first transistor 106 is dictated by a ratio of the cross-sectional area of the emitter of the first transistor 108 to the cross-sectional area of the emitter of the seventh transistor 134; and the common-emitter current gain $\beta_4$ of the fourth transistor 112 is dictated by a ratio of the cross-section area of the emitter of the fourth transistor 112 to the cross-sectional area of the emitter of the eighth transistor 138. The seventh and eighth resistors 136, 140 should be proportionally scaled with respect to the seventh and eighth transistors 134, 138 respectively.

In combination, the first and seventh transistors 106, 134 constitute a first current mirror, and the fourth and eighth transistors 112, 138 constitute a second current mirror.

In operation, the third output stage 300 can be driven by the first and second input voltages $V_{IN1}$, $V_{IN2}$ or the first and second input currents $I_{IN1}$, $I_{IN2}$. A portion of the third output stage 300 that is the basic output stage 100 operates as already described above in connection with FIG. 1 and so, again, will not be described further.

When the semiconductor laser device is current driven, the seventh transistor 134 operates as a diode section of the first current mirror, and the first transistor 108 allows the first output current $I_{O1}$ to flow, thereby causing the semiconductor laser device to operate. Similarly, the eighth transistor 138 operates as a diode section of the second current mirror, and the fourth transistor 112 allows the second output current $I_{O2}$ to flow, resulting in a balanced voltage drop across the load impedance corresponding to a voltage drop across the semiconductor laser device.

When the semiconductor laser device is voltage driven, the first input voltage $V_{IN1}$ applied by the source of the first data signal results in the first input current $I_{IN1}$ flowing into the base terminal of the first transistor 106, thereby allowing the first output current $I_{O1}$ to flow through the semiconductor laser device and the voltage drop to occur thereacross. Similarly, application of the second input voltage $V_{IN2}$ by the source of the second data signal results in the second input current $I_{IN2}$ flowing into the base terminal of the fourth transistor 112, thereby allowing the second output current $I_{O2}$ to flow through the load impedance so as to generate the balanced voltage drop thereacross corresponding to the voltage drop across the semiconductor laser device.

When the first or second input voltages $V_{IN1}$, $V_{IN2}$ rise to an unexpectedly high level, currents allowed to be drawn through the first and fourth transistors 106, 112 in response to the first and second input currents $I_{IN1}$, $I_{IN2}$ are limited as a result of the common-emitter current gains $\beta_1$, $\beta_4$ of the first and fourth transistors 106, 112 being modified by the relative sizes of the first and seventh transistors 106, 134, and by the relative sizes of the fourth and eighth transistors 112, 138.

In contrast, a differential pair configuration has an inherent output current limit by virtue of a current source, the basic, second and third output stages 100, 200, 300 do not possess such a current limiting property. Thus, for applications where the first and second output currents $I_{O1}$, $I_{O2}$ need to be limited, for example for reasons of safety, the seventh transistor 134, the seventh resistor 136, the eighth transistor 138 and the eighth resistor 140 can be employed in the configuration of the third output stage 300.

Figure 4:
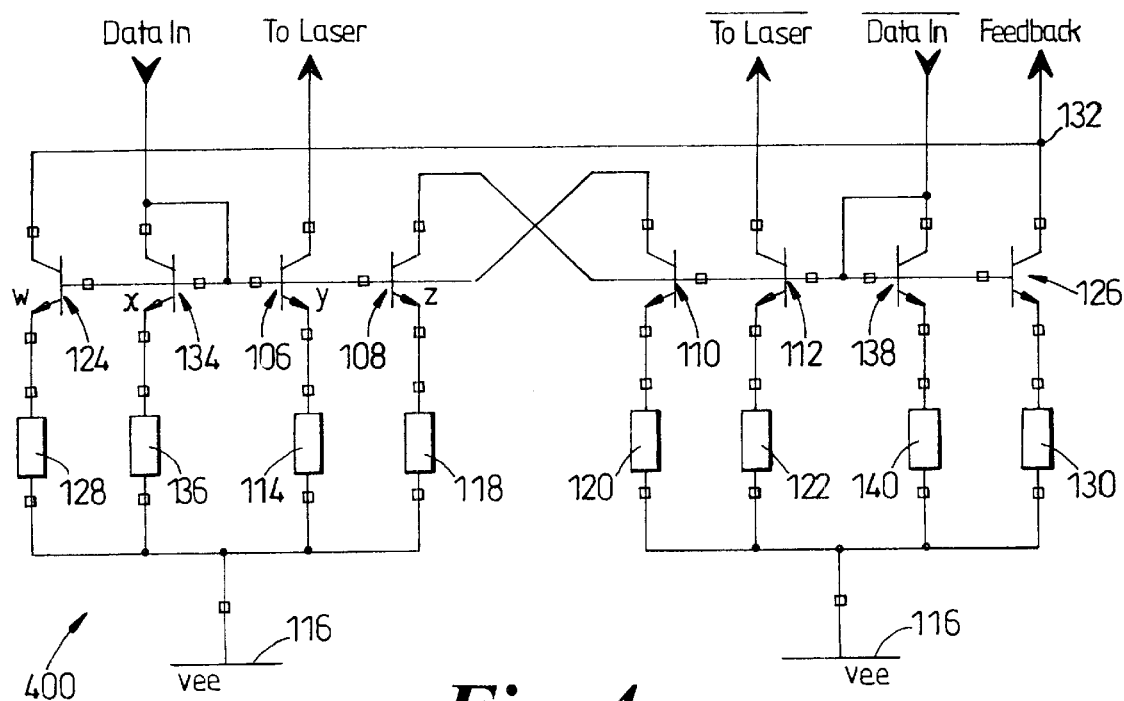
FIG. 4 is a schematic diagram of a fourth amplifier circuit including the first amplifier circuit of FIG. 1 and circuit configurations that differentiate the second and third amplifier circuits of FIGS. 2 and 3 from the first amplifier circuit.

Referring to FIG. 4, the basic output stage 100 is supplemented by the fifth, sixth, seventh and eighth transistors 124, 126, 134, 138 and the fifth, sixth, seventh and eighth resistors 128, 130, 136, 140 to form a fourth output stage 400 constituting a hybrid supplement to the basic output stage 100 with the supplementary circuit configurations of the second and third output stages 200, 300.

In operation, each part of the fourth output stage 400 operates in accordance with the operation already described above in connection with the basic, second and third output stages 100, 200, 300. Consequently, further description of the operation of the fourth output stage 400 is not necessary.

Although the above examples have been described in the context of application of the differential input signal to yield the differential output signal, the first or fourth transistor 106, 112 can be omitted and a single output signal can be taken from the remaining first or fourth transistor 106, 112 if current use needs to be conserved. Also, if required, the above described example output stage circuits can be driven by a single input voltage signal so as to yield a differential output signal.

It should be appreciated that although the above described examples comprise one or more of: the first resistor 114, the second resistor 118, the third resistor 120, the fourth resistor 122, the fifth resistor 128, the sixth resistor 130, the seventh resistor 136 and/or the eighth resistor 140, these resistors are optional and can be omitted and replaced by direct connections to the second supply rail 116.

What is claimed is:

1. An amplifier circuit apparatus comprising:
   a first input and a second input for respectively applying a first input signal and a second input signal;
   a first active device of a common emitter circuit, wherein the first input controls the first active device;
   a circuit coupled to the common emitter circuit and the second input to enable the common emitter circuit to generate an output signal that corresponds to a difference between the first input signal and the second input signal; and
   a second active device arranged to mirror a predetermined amount of current flowing through said common emitter circuit and generate a feedback component signal indicative of a current flowing through the first active device.

2. An amplifier circuit apparatus comprising:

a first input and a second input for respectively applying a first input signal and a second input signal, the first input being arranged to control a first active device of a first common emitter circuit having a first output, wherein a first circuit means is coupled to the first common emitter circuit and the second input so as to enable the first common emitter circuit to generate an output signal at the first output, the output signal corresponding to an amplification of a difference between the first input signal and the second input signal by a differential gain;

a second active device of a second common emitter circuit coupled to the second input and having a second output, the first circuit means being arranged to enable the first and second common emitter circuits to generate the output signal between the first and second outputs, the output signal corresponding to the amplification of the difference between the first input signal and the second input signal by the differential gain; and at least one further circuit means arranged to mirror a predetermined amount of current flowing through the first and/or second common emitter circuits so as to provide at least one predetermined function, wherein the at least one further circuit means includes a second circuit means having a third active device arranged to generate a first feedback component signal indicative of a first current flowing through the first active device.

3. An apparatus as claimed in claim 2, wherein the second circuit means comprises a fourth active device arranged to generate a second feedback component signal indicative of a second current flowing through the second active device.

4. An apparatus as claimed in claim 2, wherein an amplitude of a current flowing through the third active device is less than an amplitude of the first current.

5. An apparatus as claimed in claim 3, wherein an amplitude of a current flowing through the fourth active device is less than an amplitude of the second current.

6. An amplifier circuit apparatus comprising:

a first input and a second input for respectively applying a first input signal and a second input signal, the first input being arranged to control a first active device of a first common emitter circuit having a first output, wherein a first circuit means is coupled to the first common emitter circuit and the second input so as to enable the first common emitter circuit to generate an output signal at the first output, the output signal corresponding to an amplification of a difference between the first input signal and the second input signal by a differential gain;

a second active device of a second common emitter circuit coupled to the second input and having a second output, the first circuit means being arranged to enable the first and second common emitter circuits to generate the output signal between the first and second outputs, the output signal corresponding to the amplification of the difference between the first input signal and the second input signal by the differential gain; and at least one further circuit means arranged to mirror a predetermined amount of current flowing through the first and/or second common emitter circuits so as to provide at least one predetermined function, wherein the at least one predetermined function is a prevention of the output signal having a current level that exceeds a predetermined current level.

7. An apparatus as claimed in claim 6, wherein the at least one further circuit means includes third circuit means having a third active device arranged as a first integrated diode.

8. An apparatus as claimed in claim 7, wherein the third circuit means includes a fourth active device arranged as a second integrated diode.

9. An apparatus as claimed in claim 7, wherein an amplitude of a current flowing through the third active device is lower than an amplitude of a current flowing through the first active device.

10. An apparatus as claimed in claim 8, wherein an amplitude of a current flowing through the fourth active device is lower than an amplitude of a current flowing through the second active device.

11. A driver circuit for a laser device comprising an amplifier circuit apparatus, said amplifier circuit device having:

a first input and a second input for respectively applying a first input signal and a second input signal;

a first active device of a common emitter circuit having a first output, wherein the first input controls the first active device;

a circuit coupled to the common emitter circuit and the second input to enable the common emitter circuit to generate an output signal that corresponds to a difference between the first input signal and the second input signal; and a second active device arranged to mirror a predetermined amount of current flowing through said common emitter circuit and generate a feedback component signal indicative of a current flowing through the first active device.

12. An optical communications network comprising an amplifier circuit apparatus, said amplifier circuit device having:

a first input and a second input for respectively applying a first input signal and a second input signal;

a first active device of a common emitter circuit, wherein the first input controls the first active device;

a circuit coupled to the common emitter circuit and the second input to enable the common emitter circuit to generate an output signal that corresponds to a difference between the first input signal and the second input signal; and a second active device arranged to mirror a predetermined amount of current flowing through said common emitter circuit and generate a feedback component signal indicative of a current flowing through the first active device.

* * * * *